United States Patent [19]

Scarpa et al.

[11] Patent Number: 5,353,369
[45] Date of Patent: Oct. 4, 1994

[54] DEVICE FOR HEATING A CHEMICAL TANK WITH AN INERT HEAT EXCHANGE FLUID USING LINEAR AND IMPULSIVE CONTROL

[75] Inventors: Cirino Scarpa; Giuseppe Musco, both of Lentini; Alberto Falzone, Aci Catena, all of Italy

[73] Assignee: SGS-Thomson Microelectronics s.r.l., Agrate Brianza, Italy

[21] Appl. No.: 862,003

[22] Filed: Apr. 1, 1992

[30] Foreign Application Priority Data

Apr. 5, 1991 [IT] Italy .................. MI91 A 000947

[51] Int. Cl.$^5$ ...................... H04B 1/02; F28D 1/047; F24H 1/10
[52] U.S. Cl. .................................. 392/441; 126/376; 165/104.34; 165/108; 392/456; 392/496
[58] Field of Search ............... 392/441, 456, 451, 500, 392/455, 485, 488, 490, 496; 165/104.34, 104.31, 108; 126/369, 369.1, 369.2, 374, 376

[56] References Cited

U.S. PATENT DOCUMENTS

| | | | |
|---|---|---|---|
| 729,793 | 6/1903 | Powell | 126/351 |
| 1,053,906 | 2/1913 | Frampton | 126/351 |
| 1,409,019 | 3/1922 | Parnell-Smith | 392/496 |
| 1,937,226 | 11/1933 | Horch | 165/104.34 |
| 2,254,387 | 9/1941 | Olcott | 165/104.31 |
| 2,522,373 | 9/1950 | Jodell | 392/449 |
| 3,590,909 | 7/1971 | Butt | 165/108 X |
| 3,609,296 | 9/1971 | Blair | 165/104.34 |
| 4,362,149 | 12/1982 | Thomson | 165/104.31 X |
| 4,815,526 | 3/1989 | Lilkergren et al. | 165/104.34 X |
| 4,841,645 | 6/1989 | Bettcher et al. | |

FOREIGN PATENT DOCUMENTS

| | | |
|---|---|---|
| 0385382 | 5/1990 | European Pat. Off. . |
| 2562643 | 10/1985 | France ................. 126/361 |

Primary Examiner—Anthony Bartis
Attorney, Agent, or Firm—Felsman, Bradley, Gunter & Dillon

[57] ABSTRACT

A device for heating chemical tanks includes at least one heat exchanger coil immersed inside a chemical tank. An inert gas, such as nitrogen, is heated and made to flow through the coil to heat a solution in the chemical tank to the desired temperature, which is sensed by a sensor. If microfractures form in the heat exchanger coil, the inert gas simply bubbles out of the solution and does not adversely impact the purity of the solution. In addition, the bubbling of the gas indicates the presence of a microfracture. A second heating coil is provided, and also provides heated inert fluid for heating the solution in the tank. The fluid flow through the first coil is controlled linearly to maintain the temperature at the desired temperature. The fluid flow through the second coil is controlled impulsively to quickly return the solution to the desired temperature after a temperature transient occurs, such as after a relatively cool object is immersed into the solution.

11 Claims, 1 Drawing Sheet

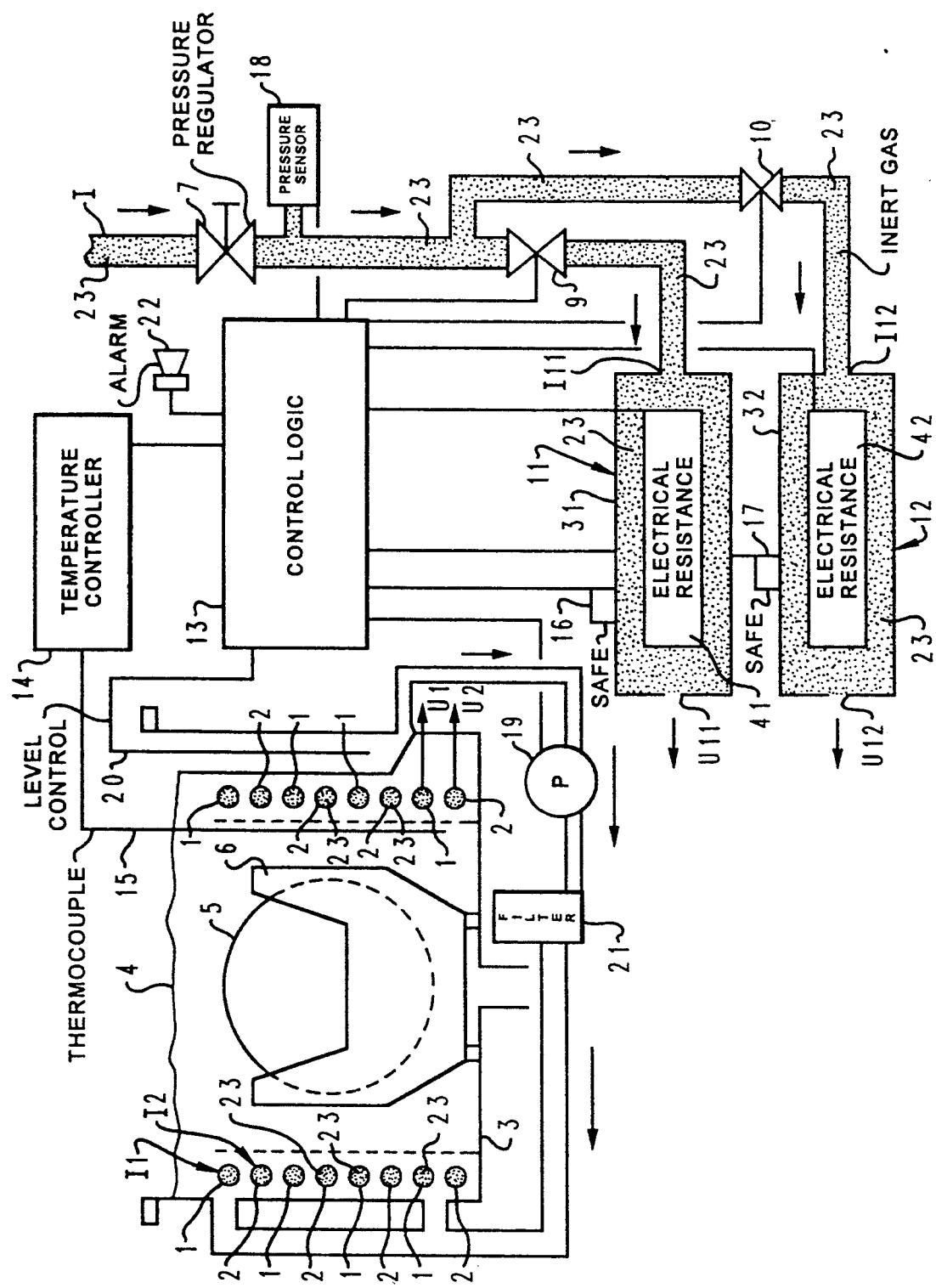

DEVICE FOR HEATING A CHEMICAL TANK WITH AN INERT HEAT EXCHANGE FLUID USING LINEAR AND IMPULSIVE CONTROL

BACKGROUND OF THE INVENTION

1. Field of the Invention

The present invention relates to a device for heating chemical tanks.

2. Description of the Prior Art

In microelectronics manufacturing, one technique for etching silicon slices involves immersing them in a solution. The solution can be, for example, a heated mixture of dilute hydrofluoric acid and ammonium fluoride in the proportion of one to seven by volume. In a typical etch process, twenty-four liters of solution must be maintained within a temperature range of 28° C. to 38° C., with a tolerance of plus or minus 1° C., according to the type of process to which the silicon is subjected.

According to the prior art, heating of the mixture takes place through the use of Teflon coated electrical resistance heaters, or of corrugated coils made of Teflon, both immersed in the solution. The coils use hot water, generated by automatic external heaters, as the heating element. A temperature sensor immersed in the solution controls the external heater so as to maintain the desired temperature of the solution.

The application of the systems described above has some drawbacks.

Insofar as the heating systems based on Teflon coated resistances are concerned, it is known that the protective coating deteriorates with use and handling due to cleaning. Microfractures are created in the Teflon coating, which allow the etching solution to directly contact the metal of the resistance. As a consequence, the solution become contaminated with metal ions.

Insofar as the heating systems based on hot water coils are concerned, microfractures are created in the corrugated Teflon coil as a result of use and handling due to cleaning. Heating water infiltrates into the etching solution through the microfractures, contaminating it with ions of various kinds present in the heating water itself.

The contaminating ions introduced into the solution by the heating systems described above deposit themselves on the silicon slices contained in the etching tank. This damages the integrity of the slices, and increases the number of rejects. The increase in rejects can become a quite significant factor.

SUMMARY OF THE INVENTION

It is therefore an object of the present invention to provide a heating system for a solution that is reliable and avoids any form of contamination.

Another object of the present invention is to provide a heating system which enhances the uniformity of the temperature of the solution.

Therefore, according to the present invention, a device for heating chemical tanks includes at least one heat exchanger coil immersed inside a chemical tank. An inert gas, such as nitrogen, is heated and made to flow through the coil to heat a solution in the chemical tank to the desired temperature, which is sensed by a sensor. If microfractures form in the heat exchanger coil, the inert gas simply bubbles out of the solution and does not adversely impact the purity of the solution. In addition, the bubbling of the gas indicates the presence of a microfracture. A second heating coil is provided, and also provides heated inert fluid for heating the solution in the tank. The fluid flow through the first coil is controlled linearly to maintain the temperature at the desired temperature. The fluid flow through the second coil is controlled impulsively to quickly return the solution to the desired temperature after a temperature transient occurs, such as after a relatively cool object is immersed into the solution.

BRIEF DESCRIPTION OF THE DRAWINGS

The features of the present invention shall be made more evident by the following detailed description of an embodiment illustrated as a non-limiting example in the sole FIGURE of the drawing.

DESCRIPTION OF THE PREFERRED EMBODIMENT

In summary, a heating device for chemical tanks comprises at least one heat exchanger coil located in the proximity of the walls and immersed inside a chemical tank containing a solution to be heated. The coil is made to circulate a flow of inert gas.

Nitrogen, for example, can be used as the inert gas. In this manner, in the case of microfractures in the Teflon coils, the presence of the inert gas introduced into the solution does not jeopardize the composition and the purity of the solution itself. In addition, immediate visualization of the loss is allowed by the bubbling of the inert gas in the solution through the microfractures. The silicon slices are not contaminated by the introduction of nitrogen into the solution.

As an alternative to the use of a single heat exchanger coil, it is possible to provide two heat exchanger coils. Pure nitrogen is fed in at the inlet of the device, and flows through both heat exchanger coils. At the inlet to the pair of coils is connected a pair of heating units. Each heating unit is suitable for receiving nitrogen under pressure. One heating unit is driven by a control unit in a linear manner for maintaining and operating temperature of the solution. The second coil is driven in an impulsive manner for the recovery of said operating temperature from transient conditions.

Such a twin coil system allows a very fine and stable adjustment of the temperature of the solution, with attainable maximum deviations and absolute values equal to one-half °C. The control unit is also suitable for driving a pair of solenoid valves for controlling the flow of nitrogen at the inlet into the pair of heating units. The control unit can interrupt the flow of nitrogen in order to switch the device off.

With reference now to the FIGURE, first and second heat exchanger coils X, 1 are arranged and intercalated with respect to each other in the proximity of the walls of a chemical tank 3. Tank 3 contains a solution 4 suitable for etching silicon slices 5 contained in corresponding containers 6. (Only one silicon slice 5 is shown in the drawing.) The solution 4 can be, for example, a mixture of HF (hydrofluoric acid) and NH$_4$F (ammonium fluoride) in the proportion of one to seven by volume. For present purposes, this solution must be maintained within a given temperature interval. In one particular example, 24 liters of the solution must be maintained within the temperature from 28° C. to 38° C. with a tolerance of plus or minus 1° C.

The coils 1, 2 are made of Teflon. A flow of pure nitrogen 23 is fed in an inlet I to the device. Immediately downstream from the inlet I there is a pressure regulator 7 for controlling the pressure of the nitrogen 23, and a pressure sensor 18 for measuring the pressure.

In succession there is a pair of solenoid valves 9, 10 suitable for regulating the flow of nitrogen 23. The valves 9, 10 are also suitable for directing the flow of nitrogen to the respective inlets I11, I12 of first and second heating units 11, 12. The outlets U11, U12 of the heating units 11, 12 are directed into the coils 1, 2. Thus, the outlets U11 and U12, respectively, are connected to the inlets I1 and I2. Each heating unit 11, 12 consists of a shell 31, 32 having a cylindrical shape which houses electrical resistances 41, 42 within. The resistances 41, 42 perform the function of heating the flow of nitrogen 23 to the preset temperature.

The device also comprises control logic 13. The control logic 13 is connected to a temperature controller 14 which is suitable for receiving signals from a thermocouple 15. These signals from the thermocouple 15 indicate the temperature of solution 4. The controller 14 sends to the control logic 13 a signal proportional to the deviation between the detected temperature and the preset temperature.

Control logic 13 is also connected to the solenoid valves 9, 10 for controlling, and possibly interrupting, the flow of nitrogen 23 toward the first and second heating units 11, 12. It is also connected to the first and second heating units 11, 12 themselves. Preferably, the first heating unit 11, connected to the first coil 1, is suitable for being driven by the control unit 13 in a linear manner. This provides for maintaining the preset temperature in the solution 4. The second heating unit 12, connected to the second coil 2, is suitable for being driven by the control unit 13 in an impulsive manner. This provides for the prompt recovery of the preset temperature of the solution 4 in the case of a transient lowering of the temperature 4. This can occur, for example, at the moment when the container 6 with the slices 5 to be processed is introduced into the solution 4. The set of two independent drives (linear and impulsive) of the heating units 11 and 12 allows a more uniform temperature of the solution 4 to be maintained. It is possible for such a device to maintain the temperature of the solution 4 with maximum deviations and absolute values equal to one-half °C.

Safety control devices 16, 17 are interposed between the control logic 13 and the heating units 11, 12. Safety control devices 16, 17, protect against excess temperatures, and intervene in case of anomalies in the heating elements 11, 12. Safety pressure sensor 18 is inserted in the line feeding nitrogen to the solenoid valves 9, 10 and is connected to the control unit 13. Pressure sensor 18 transmits a signal to the control unit 13 for automatically switching off the heating units 11, 12 in case of a pressure drop of nitrogen 23 in the line. The prevents damage to the heating elements 11, 12.

The tank 3 is provided with a pump 19 for filtered recirculation of the solution 4 through filter 21. An associated level control 20 is connected to the control unit 13, which stops the recirculation pump 19 in case of an excessive lowering of the level of the solution 4. Finally, the control unit is provided with an alarm device 22 for providing an operator with an acoustical signal in case of malfunctions in the device.

Initially, a container 6 with one or more silicon slices 5 to be processed is positioned on the bottom of the tank 3. The tank 3 is filled with a solution 4 of, for example, the type described above. Then nitrogen 23 is fed at the inlet I of the device and taken to a given pressure through the pressure regulator 7. Following the path indicated by the arrows, the nitrogen 23 flows through the solenoid valves 9, 10. These valves 9, 10 are driven by the control unit 13, which adjusts the flow of nitrogen 23 at the input to the heating units 11, 12.

Simultaneously, the control unit 13 drives the operation of the heating units 11, 12 as described above. Control unit 13 takes into account figures relating to the temperature deviations originating from the temperature controller 14. In particular, with the exclusion of an initial transitory period, the heating unit 11 is operated in a linear manner for maintaining the preset temperature in the solution 4. Heating unit 12 is driven in an impulsive manner for compensating for temperature transients in the solution 4 such as those that occur during the introduction of one or more contains 6 with the silicon slices 5 to be processed. The nitrogen 23 flowing through the heating units 11, 12 is heated up, and provided to the inlets I1 and I2 of the coils 1, 2 at the respective outlets U11, U12. During circulation in the coils 1, 2, the nitrogen cools down and give up heat to the solution 4.

During operation of the device, the temperature of the heating units 11, 12 is kept under control by the safety control devices 16, 17. Any anomalies are immediately signaled to the control unit 13, which signals the anomaly to the operator using the buzzer 22. In a similar fashion, the safety pressure switch 18 controls the pressure of the nitrogen 23. In case of a sudden drop in pressure, it transmits a signal to the control unit 13 suitable for causing the heating units 11, 12 to be switched off automatically and for signaling the anomaly with the alarm device 22.

The pump 19 and corresponding filter 21 cause a continuous filtered recirculation of the solution 4. In the event that the level of the solution 4 is lowered, as signaled by the level controller 20 to the control unit 13, recirculation is stopped and the event is signaled to the operator by the alarm device 22.

It should be noted that the device described above, in addition to allowing the heating of the solution contained in a chemical tank with minimum heat deviations, is also protected against possible micro losses from the coils. Since an inert gas is used, the composition and purity of the solution are not jeopardized, and the occurrence of such micro losses are immediately visualized by the bubbling of the nitrogen. Thus, the described device can be used in all those applications where a controlled heating of solutions is required, without running the risk of contaminating the solutions themselves.

To the described embodiment it is naturally possible to make numerous variations without going beyond the scope of the claimed invention. For example, it is possible to provide more than two heat exchanger coils, connected to an equal number of heating units, according to the mass to be heated and to the temperature of the solution.

While the invention has been particularly shown and described with reference to a preferred embodiment, it will be understood by those skilled in the art that various changes in form and detail may be made therein without departing from the spirit and scope of the invention.

What is claimed is:

1. A device for heating chemical tanks, comprising at least one heat-exchanger coil located in the proximity of walls of a chemical tank and immersed inside of it, the tank containing a solution to be heated, wherein in said at least one coil there is made to circulate a flow of inert gas, and further wherein said at least one coil comprises at least one pair of coils, intercalated one with respect to the other, said coils being connected respectively with means feeding the inert gas through respective heating units each receiving an inlet inert gas under pressure and an outlet connected to the inlet of a respective coil, at least one of said at least one heating units being driven by a control unit in a linear manner for maintaining an operating temperature of the solution and at least one other of said at least one heating unit being driven in an impulsive manner by said control unit for the recovery of said operating temperature, respectively.

2. A device according to claim 1, wherein said control unit also drives a pair of solenoid valves for controlling the flow of the inert gas at an inlet into the heating units.

3. A device according to claim 1, further comprising a temperature sensor immersed in the solution and a temperature controller suitable for transmitting to said control unit the variation of the detected temperature with respect to the preset temperature, wherein the control unit drives at least one of said heating units in response to a variation of the detected temperature.

4. A device according to claim 1 further comprising a pressure regulator connected to an inert gas supply and coupled to gas inlets of the heating units to supply inert gas under pressure to the heating units.

5. A device according to claim 1, wherein there is connected to the control unit a pressure sensor suitable, in case of a pressure fall of the inert gas in the line, for causing the control unit to switch off the heating elements.

6. A device according to claim 1, wherein each heating element comprises a shell that houses electrical resistances inside it having the function of heating the flow of inert gas.

7. A device according to claim 1, wherein each heating unit is also provided with safety control means to prevent excess temperature.

8. A device for heating a solution, comprising:
a tank containing a solution;
a first heat exchanger tube positioned within said tank for submersion in the solution;
means for providing a flow of an inert fluid at an elevated temperature through said first heat exchanger tube, wherein heat is transferred from said inert fluid into the solution;
a second heat exchanger tube positioned within said tank for submersion in the solution, wherein inert fluid also flows through said second heat exchanger; and
control means for controlling the flow of the inert fluid through said first heat exchanger to maintain the temperature of the solution at a desired level, wherein said control means further controls the flow of the inert fluid flowing through said second heat exchanger to return the temperature of the solution to the desired level after a transient change in the temperature of the solution.

9. The device of claim 8, wherein said means for providing a flow of an inert fluid comprises first and second heaters for heating the inert fluid flowing through said first and second heat exchanger tubes, respectively, and wherein said control means comprises:
a sensor for detecting the temperature of the solution; and
means for controlling the operation of said first heater linearly in response to a signal from said sensor to maintain the temperature of the solution at the desired level, and for controlling said second heater impulsively to return the temperature of the solution to the desired level after a transient change in the temperature of the solution.

10. A method for heating a solution, comprising the steps of:
causing an inert gas to flow through a first heat exchanger tube immersed in the solution, wherein leaks of gas into the solution do not contaminate the solution;
detecting a temperature of the solution;
linearly controlling the flow of the gas in the first tube to maintain the temperature of the solution at a desired level; and
causing inert gas to flow through a second heat exchanger tube immersed in the solution.

11. The method of claim 10, further comprising the step of:
impulsively controlling the flow of the inert gas in the second heat exchanger tube to return the temperature of the solution to the desired level after a transient change in the temperature of the solution.

* * * * *